(12) United States Patent
Hertz et al.

(10) Patent No.: US 11,374,527 B2
(45) Date of Patent: Jun. 28, 2022

(54) DIAGNOSABLE SOFT STARTER, DIAGNOSTIC METHOD, AND MOTOR ARRANGEMENT

(71) Applicant: Siemens Aktiengesellschaft, Munich (DE)

(72) Inventors: Dirk Hertz, Fichtenhof (DE); Johann Seitz, Amberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 284 days.

(21) Appl. No.: 16/615,003

(22) PCT Filed: May 2, 2018

(86) PCT No.: PCT/EP2018/061105
§ 371 (c)(1),
(2) Date: Nov. 19, 2019

(87) PCT Pub. No.: WO2018/215175
PCT Pub. Date: Nov. 29, 2018

(65) Prior Publication Data
US 2020/0204104 A1    Jun. 25, 2020

(30) Foreign Application Priority Data

May 22, 2017 (DE) .................... 10 2017 208 648.3

(51) Int. Cl.
| | |
|---|---|
| *H02P 1/00* | (2006.01) |
| *H02P 29/024* | (2016.01) |
| *G01R 31/327* | (2006.01) |
| *G01R 31/34* | (2020.01) |
| *H02P 27/08* | (2006.01) |

(52) U.S. Cl.
CPC ........ *H02P 29/024* (2013.01); *G01R 31/3278* (2013.01); *G01R 31/34* (2013.01); *H02P 27/08* (2013.01)

(58) Field of Classification Search
CPC .... G01R 31/3278; G01R 31/34; H02H 11/00; H02H 3/044; H02H 3/44; H02H 9/002; H02P 27/08; H02P 29/024; H02P 29/0241
(Continued)

(56) References Cited

U.S. PATENT DOCUMENTS

| | | |
|---|---|---|
| 2,122,107 A | 6/1938 | Meller |
| 7,812,696 B2 | 10/2010 | Hartinger et al. |

(Continued)

FOREIGN PATENT DOCUMENTS

| | | |
|---|---|---|
| CN | 103063978 A | 4/2013 |
| DE | 102004062267 A1 | 7/2006 |

(Continued)

OTHER PUBLICATIONS

International Prelimary Report on Patentability and English translation thereof dated Aug. 9, 2019.

(Continued)

*Primary Examiner* — Bickey Dhakal
*Assistant Examiner* — Gabriel Agared
(74) *Attorney, Agent, or Firm* — Harness, Dickey & Pierce, P.L.C.

(57) ABSTRACT

A soft starter includes a plurality of live phases, wherein a semiconductor switching element and an electromechanical switch parallel-connected thereto are arranged in each phase. In the soft starter, on a load-facing side of the semiconductor switching elements and of the electromechanical switches, the plurality of phases are connected in a circuit forming a star point. The star point circuit includes at least one passive component and is configured for detecting a reduced voltage drop in a defective state of a semiconductor switching element and/or of an electromechanical switch.

12 Claims, 4 Drawing Sheets

(58) Field of Classification Search
USPC .......................................................... 318/490
See application file for complete search history.

(56) References Cited

U.S. PATENT DOCUMENTS

| | | | | |
|---|---|---|---|---|
| 9,239,572 | B2 | 1/2016 | Korrek | |
| 2013/0314013 | A1* | 11/2013 | Ajima | .................... H02P 23/00 318/400.21 |
| 2015/0300305 | A1* | 10/2015 | Hertz | ........................ H02P 1/26 290/38 R |
| 2016/0133410 | A1* | 5/2016 | Bock | .................... H01H 47/325 361/160 |
| 2016/0133415 | A1* | 5/2016 | Bock | ...................... H01H 50/86 361/187 |
| 2017/0033720 | A1* | 2/2017 | Zeyn | .................... H02P 25/184 |

FOREIGN PATENT DOCUMENTS

| | | |
|---|---|---|
| DE | 102013209509 A1 | 11/2013 |
| DE | 102014223856 A1 | 5/2016 |
| EP | 1203434 A1 | 5/2002 |
| EP | 1744169 A2 | 1/2007 |
| EP | 2017868 A1 | 1/2009 |
| JP | H06311783 A | 11/1994 |

OTHER PUBLICATIONS

Written Opinion and English translation thereof dated May 9, 2019.
International Search Report PCT/ISA/210 for International Application No. PCT/EP2018/061105 dated May 2, 2018.
Written Opinion of the International Searching Authority PCT/ISA/237 for International Application No. PCT/EP2018/061105 dated May 2, 2018.
International Preliminary Report on Patentability PCT/IPEA/409 for International Application No. PCT/EP2018/061105 dated Aug. 9, 2019.
Written Opinion of the International Preliminary Examining Authority for International Application No. PCT/EP2918/061105 dated May 9, 2019.
German Office Action for German Application No. 10 2017 208 648.3 dated Feb. 12, 2018.

* cited by examiner

DIAGNOSABLE SOFT STARTER, DIAGNOSTIC METHOD, AND MOTOR ARRANGEMENT

PRIORITY STATEMENT

This application is the national phase under 35 U.S.C. § 371 of PCT International Application No. PCT/EP2018/061105 which has an International filing date of May 2, 2018, which designated the United States of America and which claims priority to German patent application number DE 102017208648.3 filed May 22, 2017, the entire contents of which are hereby incorporated herein by reference.

FIELD

At least one embodiment of the invention generally relates to a diagnosable soft starter and a diagnostic method for detecting a defective component in a soft starter. At least one embodiment of the invention also relates to a computer program product, by which the diagnostic method according to at least one embodiment of the invention is implemented in a soft starter. Similarly, at least one embodiment of the invention relates to motor arrangements based on the soft starter according to at least one embodiment of the invention, the diagnostic method according to at least one embodiment of the invention, or the computer program product according to at least one embodiment of the invention.

BACKGROUND

From EP2017868A1 (Phoenix Contact GmbH & Co. KG) Jan. 21, 2009, a three-phase power output stage is known, in which thyristor pairs and parallel switching contacts are arranged in the respective phases. A voltage detector is connected between the phases, which comprises a plurality of resistors for each phase. The plurality of resistors forms voltage dividers and interacts with current detectors in the individual phases. The voltage dividers and the current detectors are used for error detection in the power output stage.

From U.S. Pat. No. 2,122,107 (L. J. Meller et al.) Jun. 28, 1938, a plurality of reactants are known, which are configured inductive, capacitive or as ohmic resistors. The reactants are connected to each other and are connected to a relay coil on one end. In turn, the relay coil is connected to a star point of an electric motor at the opposite end.

DE102014223856A1 (Siemens AG) May 25, 2016 describes a circuit arrangement for controlling a three-phase electric motor, comprising one or a plurality of fuses, which are arranged in a respective phase between assigned mains connections and the electric motor, and comprising a soft starter arranged between the electric motor and the fuses. A monitoring device for monitoring the circuit arrangement for the presence of an error and one or a plurality of controllable switching elements are provided, wherein a respective switching element is connected between a phase and another phase or a return conductor, wherein, in the event that errors are detected of at least one of the switching elements, the monitoring device switches to a conductive state in order to force a triggering of the fuses.

EP1203434A1 (York Int. Corp.) May 8, 2002 describes a device for detecting a defective locked thyristor in a semiconductor control for powering a consumer during low-level operation. The device includes a voltmeter for determining the voltage at the thyristor. The device also comprises a device for reporting a defective blocked thyristor if the absolute value of the voltage at the thyristor remains below a limit value within a specified time range.

DE102013209509A1 (Hitachi Automotive Systems Ltd.) Nov. 28, 2013 describes a control device with an inverter. The control device controls the electrical power to be supplied to a motor and comprises output lines that supply outputs from the inverter to the motor. In doing so, a determination is carried out as to whether an anomaly occurs in the output lines is based on an actual neutral-point voltage of the motor, which gradually changes in accordance with a PWM impulse pattern output by the inverter, and a normal neutral-point voltage, which depends on a PWM pattern output by the inverter. In this way, it can be determined from a normal neutral-point voltage, which depends on a PWM pulse pattern (output voltage vector) in accordance with modulated waves, and an actual neutral-point voltage, which depends on a PWM impulse pattern, if an anomaly, such as a short circuit against the ground or a short circuit against the supply occurs in the output lines.

Furthermore, motor arrangements are known, which comprise soft starters and at least one downstream contactor. Such motor arrangements require at least one contactor connected downstream from the soft starter to ensure an SIL level of 1. A safety switching device is additionally required. For an SIL level of 3, at least two contactors and a safety switching device are, in turn, required in known motor arrangements. For example, such motor arrangements can be compiled based on the safety switching device 3SK1 and the soft starter 3RW4 by Siemens AG.

In automation technology, devices for actuating electric motors are required that provide a high level of safety, thereby simultaneously being simple, compact and cost-effective. In particular, the aim is to provide motor arrangements with an elevated or at least a constant level safety with a reduced level of hardware expenditure and assembly effort.

SUMMARY

At least one embodiment of the invention is based on the task of providing a soft starter, which improves the known solutions regarding the points described.

The outlined task is achieved by way of a soft starter for automation technology, which can be connected to a power supply via a plurality of phases on a mains-facing side. The soft starter comprises a semiconductor switching element in each of the phases that an electromechanical switch is arranged in parallel to. The semiconductor switching element and the electromechanical switch in the phases are configured to allow or prevent a current flow through the respective phase via coordinated actuation. The soft starter can be connected to an electrical application, for example, an electric motor, on a load-facing side of the semiconductor switching elements and the electromechanical switches.

According to at least one embodiment of the invention, a circuit forming a star point, which comprises circuit lines that are connected in a star point, is formed between the phases in the soft starter on the load-facing side of the semiconductor switching elements and the electromechanical switches. As an alternative, the circuit lines can also be connected into a triangular circuit. The circuit forming a star point thereby comprises at least one passive component, which is respectively arranged in the circuit lines of the star-point circuit. For example, a passive component is to be understood as a resistor or a capacitor. In the case of a defect of a semiconductor switching element or an electromechanical switch in a first phase, a reduced voltage drop occurs in the semiconductor switching element of the first phase due to the circuit forming a star point. The reduced voltage drop due to the circuit forming a star point can be detected by way of a voltage measuring device, which is arranged in parallel to a semiconductor switching element in the first phase. The voltage drop in the presence of a defect is reduced in relation to a voltage drop in a defect-free state. Thereby, the voltage measuring device in the first phase detects a voltage drop across the semiconductor switching element. On the basis of the voltage drop, a defect of a semiconductor switching element and/or an electromechanical switch in the first phase can be detected in the soft starter. The circuit forming a star point thus ensures a diagnostic function for defective semiconductor switching elements and/or defective electromechanical switches.

The described task is also achieved by way of a diagnostic method according to at least one embodiment of the invention. The claimed diagnostic method is configured for a soft starter, which is connected to a power supply and an electric motor via a plurality of phases. In the soft starter, a semiconductor switching element and an electromechanical switch parallel-connected thereto are attached in each phase. The diagnostic method according to the invention is used to detect a defective semiconductor switching element and/or a defective electromechanical switch. For this purpose, an actuation command is output at a first step by a control unit, by which an opening of the semiconductor switching elements and the electromechanical switches is forced. In an intended state of the soft starter, meaning one that is defect-free, the current flow is interrupted in all phases. In a further step, a voltage drop is detected across the semiconductor switching element and/or the electromechanical switch. Thereby, it is also detected whether the voltage drop is reduced in comparison to a defect-free state. This is performed by a voltage measuring device, which is connected to the corresponding phase. In the corresponding phase, a defective semiconductor switching element and/or a defective electromechanical switch can be detected if the reduced voltage drop detected using the voltage measuring device falls below an adjustable threshold. For example, the adjustable threshold is stored in a control unit, by which the diagnostic method according to the invention is performed. The threshold can be specified by a user of the soft starter and/or a higher-level control unit. In the case of a defective semiconductor switching element and/or defective electromechanical switch, the voltage that can be detected there using the voltage measuring device is significantly reduced, wherein the adjustable threshold is a measure of at what level of sensitivity this decrease is to be detected in relation to the intended state.

The underlying problem is also solved by a computer program product according to at least one embodiment of the invention. The computer program product is configured to receive measurement data generated and transmitted by a voltage measuring device. The voltage measuring device is connected to a semiconductor switching element and/or an electromechanical switch and is configured to detect a voltage drop at the semiconductor switching element and/or the electromechanical switch. The soft starter is connected to a plurality of phases and has a semiconductor switching element and an electromechanical switch parallel-connected thereto at each phase. The computer program product is also configured to send actuation commands to these semiconductor switching elements and/or the electromechanical switches. According to at least one embodiment of the invention, the incoming measurement data are processed by the computer program product and introduced into the execution of a diagnostic method. The diagnostic method thus performed is configured in accordance with at least one of the above-outlined embodiments of the diagnostic method. The computer program product is configured to be carried out in a control unit of a soft starter in accordance with at least one of the embodiments described above. The computer program product can be executed monolithically, meaning coherently, in an internal control unit of the soft starter, such as a microcontroller or a higher-level control unit. As an alternative, the computer program product can also be functionally divided and individual steps or functions of the performed diagnostic method can be distributed between the internal control unit and the higher-level control unit. The computer program product according to at least one embodiment of the invention can also be configured as software or as firmware. In addition or as an alternative, the computer program product of the invention can also be implemented in a hard-wired manner in hardware, for example, an application-specific integrated circuit, in short: an ASIC (Application-Specific Integrated Circuit).

BRIEF DESCRIPTION OF THE DRAWINGS

The invention will be described in the following based on individual embodiments. The features of the individual embodiments can be combined with each other. Precisely, the figures show.

DETAILED DESCRIPTION OF THE EXAMPLE EMBODIMENTS

Figure 1:
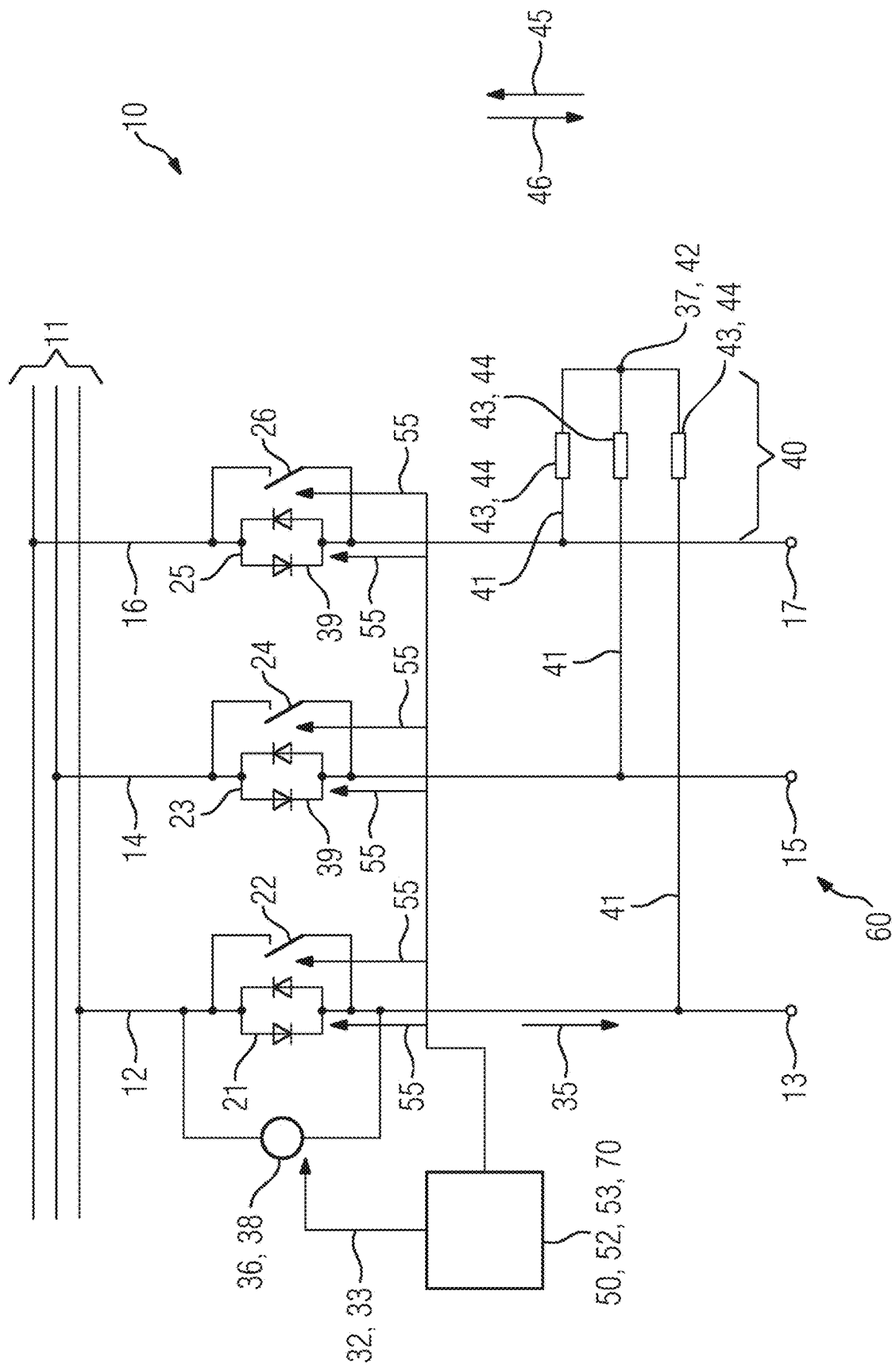
FIG. 1 an embodiment of the soft starter according to the invention.

According to at least one embodiment of the invention, a circuit forming a star point, which comprises circuit lines that are connected in a star point, is formed between the phases in the soft starter on the load-facing side of the semiconductor switching elements and the electromechanical switches. As an alternative, the circuit lines can also be connected into a triangular circuit. The circuit forming a star point thereby comprises at least one passive component, which is respectively arranged in the circuit lines of the star-point circuit. For example, a passive component is to be understood as a resistor or a capacitor. In the case of a defect of a semiconductor switching element or an electromechanical switch in a first phase, a reduced voltage drop occurs in the semiconductor switching element of the first phase due to the circuit forming a star point. The reduced voltage drop due to the circuit forming a star point can be detected by way of a voltage measuring device, which is arranged in parallel to a semiconductor switching element in the first phase. The voltage drop in the presence of a defect is reduced in relation to a voltage drop in a defect-free state. Thereby, the voltage measuring device in the first phase detects a voltage drop across the semiconductor switching element. On the basis of the voltage drop, a defect of a semiconductor switching element and/or an electromechanical switch in the first phase can be detected in the soft starter. The circuit forming a star point thus ensures a diagnostic function for defective semiconductor switching elements and/or defective electromechanical switches.

Thereby, the diagnostic function implemented in this manner along with the circuit forming a star point, which preferably only comprises passive components, and the appropriate voltage measuring device is based on a minimum of components and can therefore be produced in a compact and cost-effective manner. The diagnostic function is also possible if the connected electrical load, for example the electric motor, is switched off. The circuit forming a star point on the load-facing side of the semiconductor switching elements and the electromechanical switches of the soft starter offers a high degree of reliability and provides the soft starter with the possibility to quickly detect an intrinsic defect. With the soft starter according to the invention, therefore, an SIL level of 1 can be achieved without additional components, such as contactors. When using the soft starter according to the invention, a contactor can be dispensed with in motor arrangements without compromising the safety of the entire motor arrangement.

In a preferred embodiment, the at least one passive component is configured as a resistor with 10 k$\Omega$ to 500 k$\Omega$ in the star-point circuit. A resistor in this value range limits the power dissipation in the circuit forming a star point to a tolerable level. Simultaneously, a resistor in this value range allows a voltage drop on the semiconductor switching elements, which is sufficiently high for reliable detection.

Being furthermore preferred in each of the phases, in particular, in the case of three phases, a resistor is arranged in each of the circuit lines of the circuit forming a star point. The resistors in the circuit lines of the star-point circuit have equal resistance values, thereby being particularly preferred. This ensures an even voltage distribution on the intact semiconductor switching elements when a defective semiconductor switching element and/or a defective electromechanical switch are detected. Furthermore, resistors with the same resistance values in each phase ensure a stable continuous operation of the soft starter according to at least one embodiment of the invention and an even distribution of the resulting power dissipation.

Furthermore, in the soft starter according to to at least one embodiment of the invention, the voltage measuring device can be connected to a control unit. Via the connection, measurement data can be transferred to the control unit. The control unit is configured to send actuation commands to the semiconductor switching elements and/or the electromechanical switches, meaning to open or close them. Furthermore, the control unit comprises a memory and a computing unit suitable for the storage and execution of a computer program product, by which the operation of the soft starter according to the invention can be implemented. By way of the control unit, it is possible to check whether the detected reduced voltage drop in the star-point circuit falls below an adjustable threshold, whereby a defect of a semiconductor switching element and/or electromechanical switch is identifiable. Likewise, after detecting such a defect, the control unit allows for the active initiation of countermeasures, for example, the suppression of actuation commands, which force a closing of the intact semiconductor switching elements and/or electromechanical switches.

The control unit of the soft starter is preferably formed as an internal control unit, which is arranged, for example, in the form of a microcontroller in the soft starter. Alternatively, the control unit can also be formed as a higher-level control unit. Among other things, this can comprise a safety switching device, a parameterizing device, or a programmable logic controller, in short: a PLC, or a cloud. Furthermore, as an alternative, the functions of the control unit can also be divided into an internal and a higher-level control unit, which interact in order to operate the soft starter according to at least one embodiment of the invention.

The soft starter according to at least one embodiment of the invention can comprise a voltage measuring device in each of the phases. The voltage measuring device are arranged in the at least one phase in such a way that a voltage drop can be detected across the respective semiconductor switching element and the corresponding electromechanical switch. In the case of a defective semiconductor switching element and/or a defective electromechanical switch, there is a lower voltage drop due to the circuit forming a star point than on an intact blocking semiconductor switching element with the corresponding parallel opened electromechanical switch. This makes the detection of defective semiconductor switching elements and/or defective electromechanical switches even possible if the load-side connections or a downstream switching device, for example a contactor, is opened. This ensures a differentiated identification of the defect that has occurred and the achievement of an increased SIL level.

The outlined task is also achieved by way of a motor arrangement according to at least one embodiment of the invention. The motor arrangement has an SIL level of 1 and thus meets an application-specific safety requirement. The motor arrangement comprises an electric motor that is directly connected to a soft starter. The soft starter, on the other hand, is connected to a power supply with a plurality of phases. Thereby, the soft starter is configured in accordance with one of the embodiments outlined in the above. The motor arrangement according to at least one embodiment of the invention is free of additional contactors and provides a high degree of safety. In particular, Safety Integrity Level 1, or SIL 1 in short, is achieved. The motor arrangement according to at least one embodiment of the invention therefore offers a correspondingly high level of safety with a reduced expenditure of components compared to the known solutions. The motor arrangement can therefore be produced quickly, easily and cost-effectively.

Likewise, the underlying task is solved by way of another motor arrangement according to at least one embodiment of the invention. The motor arrangement has an SIL level of 3 and thus is suitable for safety-critical applications. The motor arrangement includes an electric motor that is supplied with power across a plurality of phases. The motor arrangement is therefore also coupled with a corresponding multiphase power supply. A contactor is connected upstream from the electric motor, which contactor, in turn, a soft starter is connected upstream from. In turn, the soft starter is connected to the multiphase power supply. This means that the electrical energy required for the operation of the electric motor is transferred to the electrical motor from the multiphase power supply via the soft starter and the contactor connected downstream from the soft starter. According to the invention, the soft starter is configured in accordance with one of the embodiments outlined in the above. The motor arrangement according to at least one embodiment of the invention therefore provides an SIL level of 3 with only one contactor. Compared to the well-known solutions with two contactors, this represents a reduction in hardware expenditure. The motor arrangement according to at least one embodiment of the invention achieves a total Safety Integrity Level, referred to as SIL in short, of 3 with a reduced number of components. This allows the motor arrangement according to at least one embodiment of the invention to be produced simply, quickly and cost-effectively.

The described task is also achieved by way of a diagnostic method according to at least one embodiment of the invention. The claimed diagnostic method is configured for a soft starter, which is connected to a power supply and an electric motor via a plurality of phases. In the soft starter, a semiconductor switching element and an electromechanical switch parallel-connected thereto are attached in each phase. The diagnostic method according to the invention is used to detect a defective semiconductor switching element and/or a defective electromechanical switch. For this purpose, an actuation command is output at a first step by a control unit, by which an opening of the semiconductor switching elements and the electromechanical switches is forced. In an intended state of the soft starter, meaning one that is defect-free, the current flow is interrupted in all phases. In a further step, a voltage drop is detected across the semiconductor switching element and/or the electromechanical switch. Thereby, it is also detected whether the voltage drop is reduced in comparison to a defect-free state. This is performed by a voltage measuring device, which is connected to the corresponding phase. In the corresponding phase, a defective semiconductor switching element and/or a defective electromechanical switch can be detected if the reduced voltage drop detected using the voltage measuring device falls below an adjustable threshold. For example, the adjustable threshold is stored in a control unit, by which the diagnostic method according to the invention is performed. The threshold can be specified by a user of the soft starter and/or a higher-level control unit. In the case of a defective semiconductor switching element and/or defective electromechanical switch, the voltage that can be detected there using the voltage measuring device is significantly reduced, wherein the adjustable threshold is a measure of at what level of sensitivity this decrease is to be detected in relation to the intended state.

The diagnostic method according to at least one embodiment of the invention offers a possibility for precisely identifying in which of the phases the defective component is to be found.

Along with the circuit forming a star point, the diagnostic method is supported by an easily manufacturable hardware, is robust and can be produced in a cost-efficient manner according to at least one embodiment of the invention. Furthermore, the diagnostic method only requires a minimum of measurement data and can be easily implemented, for example, in the form of a computer program product. The diagnostic method according to at least one embodiment of the invention only requires a low level of computing power and can also be executed in a rapid manner on control units with a low level of computing capacity. A quick execution of the diagnostic method makes it possible to initiate countermeasures quickly if necessary and thus avoid further damage to the soft starter or the connected electric motor. The diagnostic method ensures that the soft starter has an SIL level of 1 on its own. Motor arrangements with elevated safety requirements can be implemented with a reduced expenditure of additional components due to this.

In another preferred embodiment of the invention, a warning is output during the diagnostic method if a defective semiconductor switching element and/or a defective electromechanical switch is/are detected. In addition or as an alternative, by way of the control unit, which is configured to send actuation commands to the semiconductor switching elements and the electromechanical switch, a countermeasure can also be carried out if a defective component is detected. Thereby, any actuation for closing the semiconductor switching elements and/or the electromechanical switches is suppressed by the control unit by way of appropriate programming. For example, this takes place by the corresponding actuation commands being inhibited by the control unit, which are, for example, sent by a higher-level control unit or are caused by a user entry. By way of this, a further damaging of the soft starter and/or a connected application, such as an electric motor, for example, is prevented. In addition, the risk of endangering persons is prevented. The achievable level of security is thus further increased.

In another preferred embodiment of the invention, the diagnostic method is applied in the following motor arrangement: The motor arrangement comprises a load-forming multiphase electric motor, which is supplied with power via a plurality of phases from a multiphase power supply. The electric motor is connected upstream from a switching device, for example, a contactor, which, in turn, a soft starter is connected upstream from. In turn, the soft starter is connected to the multiphase power supply. The electrical energy required for the operation of the electric motor is transferred to the electrical motor from the multiphase power supply via the soft starter and the switching device connected downstream from the soft starter. In the soft starter, a semiconductor switching element and an electromechanical switch parallel-connected thereto are attached in each phase. In the soft starter, the phases are connected in a circuit forming a star point on a load-facing side of the semiconductor switching elements and of the electromechanical switch, wherein the circuit forming a star point comprises at least one passive component. Thereby, the circuit forming a star point is used for detecting a voltage drop in a defective state of a semiconductor switching element and/or of an electromechanical switch with the aid of the diagnostic method. For this purpose, an actuation command is output at a first step by a control unit, by which an opening of the semiconductor switching elements and the electromechanical switches is forced. In an intended state of the soft starter, meaning one that is defect-free, the current flow is interrupted in all phases. At another step, an actuation command is output by the control unit, via which an opening of contacts of the switching device is specified, to which the live phases are connected. The switching device is thus placed in a state with open contacts in the phase conductors. At another step, a voltage drop is detected across the semiconductor switching element and/or the electromechanical switch of the soft starter. Thereby, it is also detected whether the voltage drop is reduced in comparison to a defect-free state. This is performed by a voltage measuring device, which is connected to the corresponding phase. In the corresponding phase, a defective semiconductor switching element and/or a defective electromechanical switch can be detected if the reduced voltage drop detected using the voltage measuring device falls below an adjustable threshold. For example, the adjustable threshold is stored in a control unit, by which the diagnostic method is performed. The threshold can be specified by a user of the soft starter and/or a higher-level control unit. In the case of a defective semiconductor switching element and/or defective electromechanical switch, the voltage that can be detected there using the voltage measuring device is significantly reduced, wherein the adjustable threshold is a measure of at what level of sensitivity this decrease is to be detected in relation to the intended state.

The soft starter has a lower-impedance than the downstream switching device. If the voltage drop would be detected across the semiconductor switching element and/or the electromechanical switch of the soft starter without the circuit of the soft starter forming a star point, an undefined voltage value would be obtained, caused by parasitic resistances, etc. This undefined voltage value could not be used for a reliable diagnosis of the soft starter. The circuit forming a star point thus ensures a diagnostic function for defective semiconductor switching elements and/or defective electromechanical switches of the soft starter. The diagnostic method is configured for a soft starter, which is connected to a power supply via a plurality of phases and to an electric motor via a switching device.

The underlying problem is also solved by a computer program product according to at least one embodiment of the invention. The computer program product is configured to receive measurement data generated and transmitted by a voltage measuring device. The voltage measuring device is connected to a semiconductor switching element and/or an electromechanical switch and is configured to detect a voltage drop at the semiconductor switching element and/or the electromechanical switch. The soft starter is connected to a plurality of phases and has a semiconductor switching element and an electromechanical switch parallel-connected thereto at each phase. The computer program product is also configured to send actuation commands to these semiconductor switching elements and/or the electromechanical switches. According to at least one embodiment of the invention, the incoming measurement data are processed by the computer program product and introduced into the execution of a diagnostic method. The diagnostic method thus performed is configured in accordance with at least one of the above-outlined embodiments of the diagnostic method. The computer program product is configured to be carried out in a control unit of a soft starter in accordance with at least one of the embodiments described above. The computer program product can be executed monolithically, meaning coherently, in an internal control unit of the soft starter, such as a microcontroller or a higher-level control unit. As an alternative, the computer program product can also be functionally divided and individual steps or functions of the performed diagnostic method can be distributed between the internal control unit and the higher-level control unit. The computer program product according to at least one embodiment of the invention can also be configured as software or as firmware. In addition or as an alternative, the computer program product of the invention can also be implemented in a hard-wired manner in hardware, for example, an application-specific integrated circuit, in short: an ASIC (Application-Specific Integrated Circuit).

The computer program product according to at least one embodiment of the invention allows for easy adjustability of the diagnostic method to be carried out in the case of appropriately configured soft starters and/or higher-level control units via common human-machine interfaces attached to them, in short: HMIs. This also comprises additional parameters that characterize the interaction of the method according to the invention with further functions of an automation system. For example, this can be a selection of a warning that is output after a countermeasure is initiated. The implementation of the diagnostic method via a computer program product also makes it possible to retrofit this in the case of an existing automation system.

FIG. 1 schematically shows an embodiment of the soft starter 10 according to the invention. The soft starter 10 is connected to a power supply 11 and comprises three phases 12, 14, 16. Each of the phases 12, 14, 16 comprises a connection terminal 13, 15, 17 on a load-facing end. The term load-facing and its counterpart, namely mains-facing, refer to the respective side of the soft starter 10, at which an application, which is not specified in more detail, in particular, an electric motor 60, can be connected, or the side, at which the soft starter 10 is connected to the power supply 11. The position of a load-facing side is represented in FIG. 1 by the arrow 46, the position of a mains-facing side by the arrow 45.

In each of phases 12, 14, 16, a semiconductor switching element 21, 23, 25 is arranged, which is configured to interrupt or enable the current flow through the respective phase 12, 14, 16 under interaction with an electromechanical switch 22, 24, 26. The semiconductor switching elements 21, 23, 25 and the electromechanical switches 22, 24, 26 are controlled by a control unit 50, which is configured to send actuation commands 55 to the semiconductor switching elements 21, 23, 25 and the electromechanical switches 22, 24, 26. The control unit 50 is configured as an internal control unit 52, which is structurally integrated into the soft starter 10. The internal control unit 52 is configured as a microcontroller, which is configured to store and execute a computer program product 70.

On a load-facing side of the semiconductor switching elements 21, 23, 25 and the electromechanical switches 22, 24, 26, a circuit 40 forming a star point is arranged, which connects the phases 12, 14, 16 at an artificial star point 42. In each of the circuit lines 41, a passive component 43 is arranged, which is respectively formed as resistor 44. A voltage measuring device 36 is assigned to the semiconductor switching element 21 and the electromechanical switch 22 in a first phase 12, which is suitable for detecting a voltage drop 38 at the semiconductor switching element 21 and the electromechanical switch 22. For this purpose, the voltage measuring device 36 is connected to the control unit 50. The voltage measuring device 36 generates measurement data 33 via its measuring accesses 32, which are forwarded to the control unit 50. The measurement data 33 serve as input for the computer program product 70, which is executed in the control unit 50.

In the case of a defect in the semiconductor switching element 21 and or the electronic switch 22 in the first phase 12, which can be caused, for example, due to a shorting or a contact welding, a reduced voltage drop 38 at the semiconductor switching element 21 and the electromechanical switch 22 in the first phase 12 results.

In the occurrence of the defect in the semiconductor switching element 21 and/or the electromechanical switch 22 in the first phase 12, the voltage drop 38 on the semiconductor switching element 21 and the electromechanical switch 22 in the first phase 12 is significantly reduced. If a threshold 53, which is not specified in more detail and which is stored in the control unit 50, is fallen below, this is identified as the previously detected defect in the first phase 12 being present. In the case of a soft starter with a voltage measuring device 36 in a plurality of phases 12, 14, 16, it can therefore be identified in which of phases 12, 14, 16 the defective semiconductor switching element 21 and/or the defective electromechanical switch 22 are present. Furthermore, if a defect is detected by the computer program product 70 in the control unit 50 countermeasures can be introduced. This includes, among other things, the suppression of actuation commands 55, which force a closing of the semiconductor switching elements 21, 23, 25 and/or the electromechanical switches 22, 24, 26.

Figure 2:
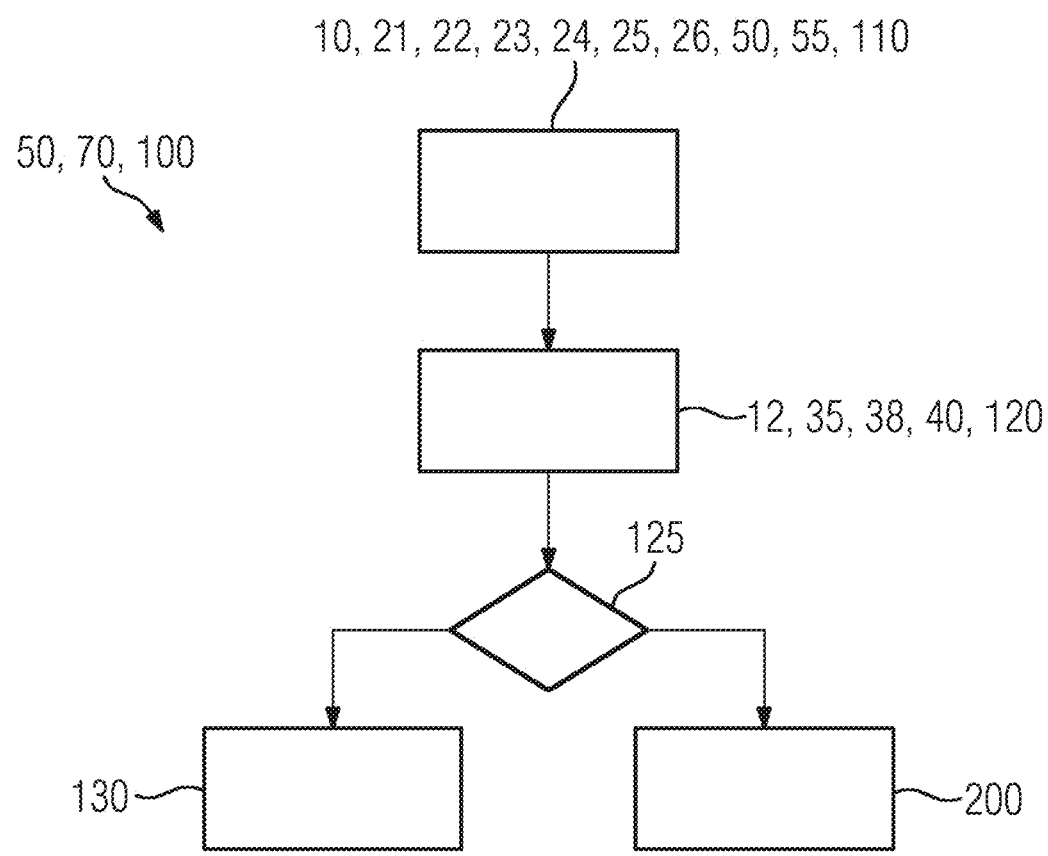
FIG. 2 a sequence of an embodiment of the diagnostic method according to the invention.

FIG. 2 schematically shows the sequence of an embodiment of the diagnostic method according to the invention 100 for the detection of a defective semiconductor switching element 21, 23, 25 and/or electromechanical switch 22, 24, 26 in a soft starter 10, which is not specified in further detail.

The diagnostic method 100 comprises a first method step 110, in which an actuation command 55 for opening the semiconductor switching elements 21, 23, 25 and the electromechanical switch 22, 24, 26 is output by a control unit 50. This interrupts the current flow in the phases with intact semiconductor switching elements 21, 23, 25 and intact electromechanical switches 22, 24, 26.

In a second method step 120, a voltage drop 38 is detected above the semiconductor switching element 21 and the electromechanical switch 22 in the first phase 12. The circuit 40 forming a star point is attached to a load-facing side of the semiconductor switching elements 21, 23, 25 and the electromechanical switch 22, 24, 26. In the event a defective semiconductor switching element 21, 23, 25 and/or a defective electromechanical switch 22, 24, 26 is present in the first phase 12, there is a galvanic connection 35 in this. Thereby, the galvanic connection 35 causes a voltage drop 38 at the semiconductor switching element 21 and the electromechanical switch 22 in the first phase 12 via the circuit 40 forming a star point. The sequence of the diagnostic method 100 branches out depending on the result of the detection of the voltage drop 38. This is shown in FIG. 2 by branch 125. If, at the second method step 120, a voltage drop 38 is detected, it is detected on the basis of this that the semiconductor switching element 21 and the electromechanical switch 22 in the first phase 12 are intact. This represents a final state of 200 of diagnostic method 100. If no voltage drop 38 is detected, a third method step 130 follows. At the third method step 130, a warning is output, thereby informing a user or a higher-level control unit. In particular, in the third step 130 countermeasures are initiated, which prevent the soft starter 10 from switching on again.

Figure 3:
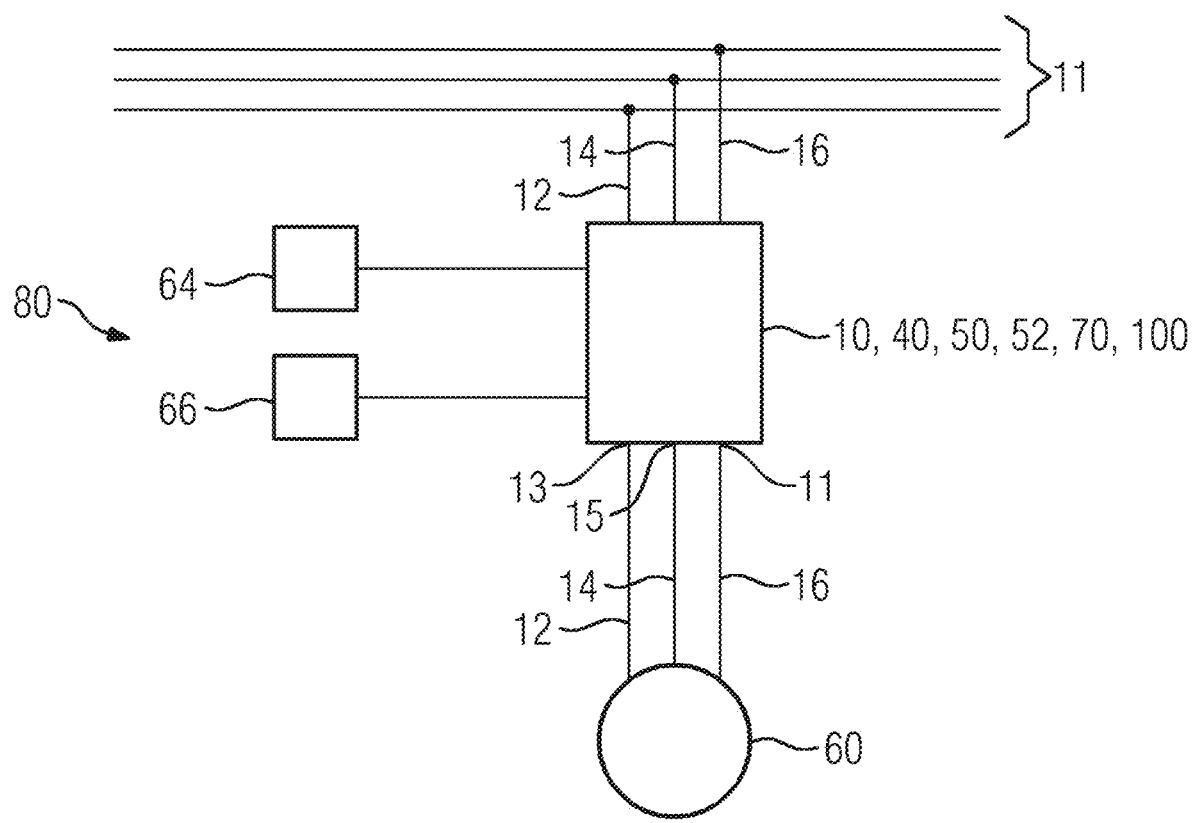
FIG. 3 an embodiment of a motor arrangement according to the invention.

FIG. 3 schematically shows the construction of an embodiment of a motor arrangement 80 according to the invention, which is connected to a multiphase power supply 11. The motor arrangement 80 comprises an electric motor 60, which is supplied with power via a first, second and third phase 12, 14, 16. Between the power supply 11 and the electric motor 60, a soft starter 10 is connected, which has terminals 13, 15, 17, to which the electric motor 60 is connected. The soft starter 10 has a circuit 40, which is not specified in further detail and forms a star point, as shown for example in FIG. 1. The soft starter 10 has a control unit 50, which is configured as an internal control unit 52. The control unit 50 has a memory and a computer unit and is configured to store a computer program product 70. The computer program product 70 is executed by the control unit 50 and ensures a diagnostic function for the soft starter 10 in accordance with the diagnostic method 100 according to the invention. Furthermore, the soft starter 10 is configured with an operating switch 64 for operating actuation of the electric motor 60. The power switch 64 is coupled with the control unit 50. Similarly, a safety-oriented switch 66 is connected to the soft starter 10, by which the electric motor 60 can be quickly and reliably brought into a safe state. For this purpose, the safety-oriented switch 66 is configured as an emergency stop. The motor arrangement 80 in accordance with FIG. 3 has an SIL level of 1 due to the diagnostic function in the soft starter 10. The application of an additional contactor is unnecessary. Consequently, the motor arrangement 80 in accordance with FIG. 3 achieves an improved level of safety with reduced hardware expenditure.

Figure 4:
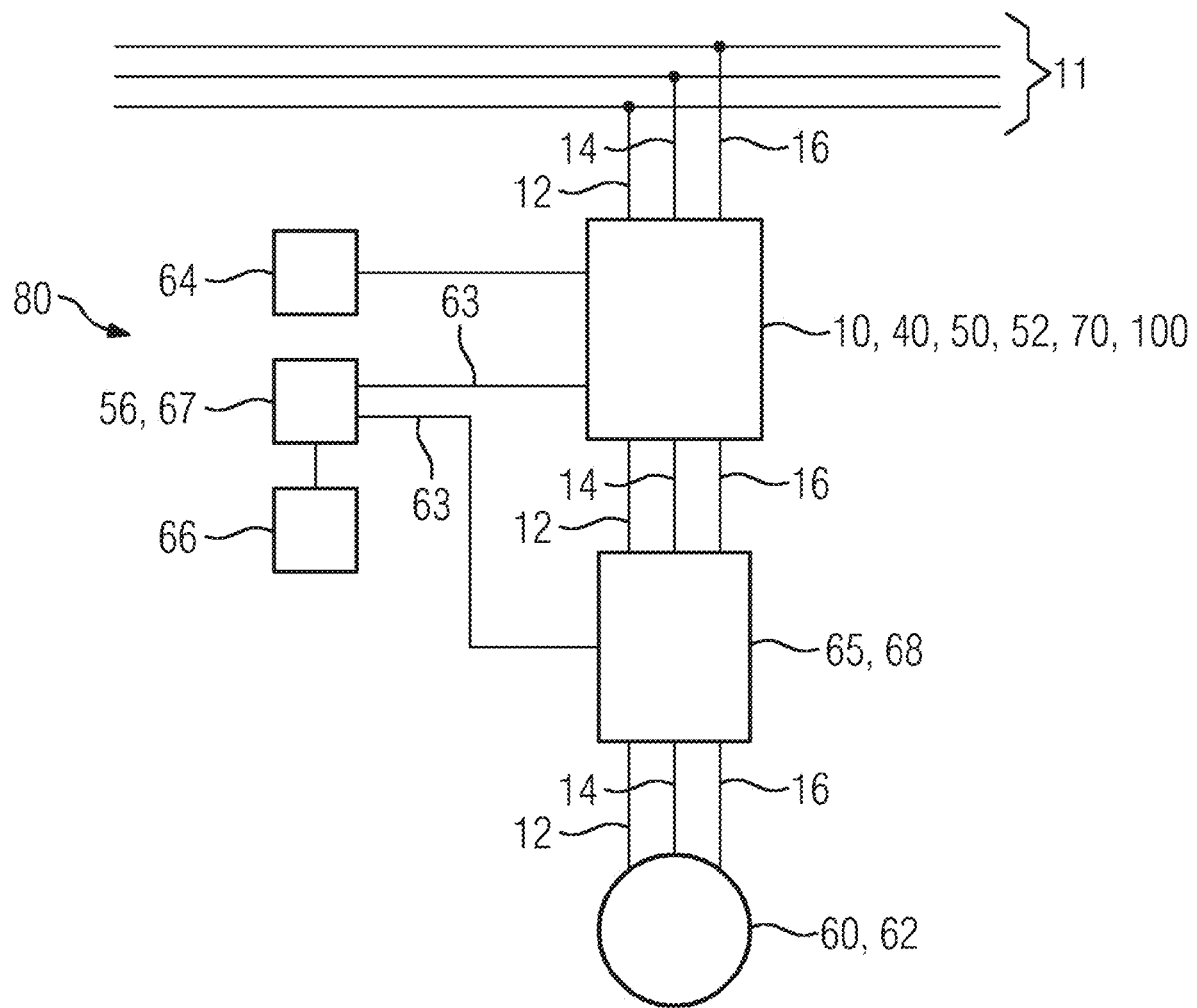
FIG. 4 an embodiment of another motor arrangement according to the invention.

FIG. 4 schematically shows the construction of an embodiment of another motor arrangement 80, which is connected to a multiphase power supply 11. The motor arrangement 80 also comprises an electric motor 60. The electric motor 60 is supplied with power via three phases 12, 14, 16. A soft starter 10, as shown for example in FIG. 1, is connected to the power supply 11. In turn, a switching device 68 configured as a contactor 65 is connected downstream from the soft starter 10. The soft starter 10 is connected to an operating switch 64, via which the operating actuation of the electric motor 60 takes place. Furthermore, the soft starter 10 is coupled with a safety switching device 67, which is coupled with both the soft starter 10 as well as the switchgear 68 respectively via a communication connection 63. The safety switching device 68 is configured to record the state of the soft starter 10 by communication with the control unit 50 of the soft starter 10 and to send commands to the control unit 50 of the soft starter 10 in the sense of a higher-level control unit 56. Similarly, the safety switching device 68 is coupled with the switching device 68 in such a way that the state of the switching device 68 is detectable. For this purpose, the contactor 65 has signal contacts that are not shown in more detail. The safety switching device 67 is also configured to send commands to the switching device 68. In addition, the safety switching device 68 is connected to a safety-oriented switch 66, which is configured as an emergency stop. The safety-oriented switch 66 quickly causes a safe state of the electric motor 60 to occur if necessary, for example in the event of an emergency.

The soft starter 10 has a circuit 40 forming a star point, by way of which circuit, in connection with the control unit 50, which is configured as an internal control unit 52, diagnostic methods 100 can be carried out, by way of which defective components, in particular defective semiconductor switching elements 21, 23, 25 and defective electromechanical switches 22, 24, 26 as shown in FIG. 1, can be automatically identified in the soft starter 10. This is done via a diagnostic method 100, which is implemented via a computer program product 70, which is stored in the control unit 40 in a way that it can be executed.

Due to the combination of the soft starter 10 according to at least one embodiment of the invention with a switching device 68, here meaning the contactor 65, an SIL level of 3 is achieved in the motor arrangement 80 in accordance with FIG. 4. Thereby, the soft starter 10 and the switching device 68 are diversified in relation to one another. The motor arrangement 80 reaches a total Safety Integrity Level, referred to in short as SIL, of 3. In contrast, the solutions known from the prior art require at least two switching devices, in particular, contactors. The motor arrangement according to at least one embodiment of the invention therefore offers a high degree of safety with reduced hardware expenditure. This simplifies, accelerates and makes more cost-efficient the structure of the motor arrangement according to at least one embodiment of the invention.

The invention claimed is:

1. A motor arrangement with a SIL level of 3, comprising:
   a soft starter;
   a switching device; and
   an electric motor connected to the switching device, whereby the soft starter is connected upstream to the switching device, the soft starter being coupled with a power supply, the soft starter including a plurality of live phases,
   wherein a respective semiconductor switching element and a respective electromechanical switch, parallel-connected to the respective semiconductor switching element, and a voltage measuring device for detecting a voltage drop occurring across the semiconductor switching element and the corresponding electromechanical switch are arranged in each respective phase of the plurality of live phases, wherein, in the soft starter, on a side of the respective semiconductor switching elements and the respective electromechanical switches facing the electric motor, the plurality of live phases are connected in a circuit forming a star point, the circuit forming the star point including at least one passive component and being configured to detect a voltage drop in a defective state of at least one of the respective semiconductor switching element and the respective electromechanical switch occurring across a respective semiconductor switching element and a respective electromechanical switch parallel-connected to the respective semiconductor switching element.

2. The motor arrangement of claim 1, wherein the at least one passive component is configured as a resistor with 10 kΩ to 500 kΩ.

3. The motor arrangement of claim 2, wherein the soft starter is provided with a control unit, configured as at least one of an internal control unit and a higher-level control unit.

4. The motor arrangement of claim 1, wherein the at least one passive component is configured as a capacitor.

5. The motor arrangement of claim 4, wherein the capacitor has a capacity of 4 nF to 400 nF.

6. The motor arrangement of claim 5, wherein the soft starter is provided with a control unit, configured as at least one of an internal control unit and a higher-level control unit.

7. The motor arrangement of claim 4, wherein the soft starter is provided with a control unit, configured as at least one of an internal control unit and a higher-level control unit.

8. The motor arrangement of claim 1, wherein the soft starter is provided with a control unit, configured as at least one of an internal control unit and a higher-level control unit.

9. A diagnostic method for detection of at least one of a defective semiconductor switching element of a plurality of semiconductor switching elements, and a defective electromechanical switch of a plurality of electromechanical switches in a soft starter including a plurality of live phases, the soft starter being an integral part of a motor arrangement with an SIL level of 3, the motor arrangement further including an electric motor connected to a switching device, whereby the soft starter is connected upstream to the switching device, the soft starter being coupled with a power supply, the diagnostic method comprising:

outputting an actuation command for opening the plurality of semiconductor switching elements and the plurality of electromechanical switches, the outputting including outputting of the actuation command for opening contacts of the switching device, through which the plurality of live phases are connected;

detecting a reduced voltage drop occurring across a respective semiconductor switching element, of the plurality of semiconductor switching elements and a respective electromechanical switch, of the plurality of electromechanical switches, parallel-connected to the respective semiconductor switching element in one of the plurality of live phases, connected to other live phases of the plurality of live phases via a circuit forming a star point arranged in the soft starter on a side of the plurality of semiconductor switching elements and the plurality of electromechanical switches facing the electric motor; and detecting a defect in one of the plurality of semiconductor switching elements or one of the plurality of electromechanical switches upon the reduced voltage drop being detected.

10. The diagnostic method of claim 9, further comprising outputting a warning upon at least one of a detected defect and an actuation for closing at least one of the plurality of semiconductor switching elements and the plurality of electromechanical switches, being suppressed by way of a control unit.

11. A non-transitory computer program product storing a computer program for receiving measurement data of a measuring device connected to at least one of the plurality of semiconductor switching elements and the plurality of electromechanical switches of the soft starter, and for outputting the actuation command to at least one of the plurality of semiconductor switching elements and the plurality of electromechanical switches of the soft starter, the computer program being configured to carry out the diagnostic method of claim 10, when executed by a computer.

12. A non-transitory computer program product storing a computer program for receiving measurement data of a measuring device connected to at least one of the plurality of semiconductor switching elements and the plurality of electromechanical switches of the soft starter, and for outputting the actuation command to at least one of the plurality of semiconductor switching elements and the plurality of electromechanical switches of the soft starter, the computer program being configured to carry out the diagnostic method of claim 9, when executed by a computer.

* * * * *